United States Patent
Kunieda et al.

(10) Patent No.: US 11,150,113 B2
(45) Date of Patent: Oct. 19, 2021

(54) STEERING DEVICE

(71) Applicant: AISIN SEIKI KABUSHIKI KAISHA, Kariya (JP)

(72) Inventors: Yoshihiro Kunieda, Kariya (JP); Haruki Tsuji, Kariya (JP)

(73) Assignee: AISIN CORPORATION, Kariya (JP)

( * ) Notice: Subject to any disclaimer, the term of this patent is extended or adjusted under 35 U.S.C. 154(b) by 160 days.

(21) Appl. No.: 16/684,649

(22) Filed: Nov. 15, 2019

(65) Prior Publication Data
US 2020/0158540 A1    May 21, 2020

(30) Foreign Application Priority Data
Nov. 16, 2018  (JP) .............................. JP2018-215767

(51) Int. Cl.
| | |
|---|---|
| *G01D 5/241* | (2006.01) |
| *B62D 1/04* | (2006.01) |
| *H03K 17/96* | (2006.01) |
| *G01D 5/24* | (2006.01) |

(52) U.S. Cl.
CPC .............. *G01D 5/241* (2013.01); *B62D 1/04* (2013.01); *G01D 5/24* (2013.01); *H03K 17/962* (2013.01); *B62D 1/046* (2013.01)

(58) Field of Classification Search
CPC .. G01D 5/00; G01D 5/12; G01D 5/14; G01D 5/24; G01D 5/2405; G01D 5/241; B62D 1/00; B62D 1/02; B62D 1/04; B62D 1/046; B60W 40/00; B60W 40/08; H03K 17/00; H03K 17/94; H03K 17/96; H03K 17/962

USPC ....... 324/600, 649, 658, 661, 663, 671, 686, 324/500, 512, 519; 345/173, 174

See application file for complete search history.

(56) References Cited

U.S. PATENT DOCUMENTS

| | | | | |
|---|---|---|---|---|
| 2006/0273806 | A1* | 12/2006 | Kirchner | ............... H03K 17/962 324/686 |
| 2011/0246028 | A1* | 10/2011 | Lisseman | ............... B62D 1/065 701/45 |
| 2013/0024071 | A1* | 1/2013 | Sivertsen | ................. B62D 1/04 701/41 |

(Continued)

FOREIGN PATENT DOCUMENTS

| | | |
|---|---|---|
| JP | 2013079057 A | 5/2013 |
| JP | 2018109852 A | 7/2018 |
| JP | 2018127011 A | 8/2018 |

*Primary Examiner* — Hoai-An D. Nguyen
(74) *Attorney, Agent, or Firm* — Buchanan Ingersoll & Rooney PC (57) ABSTRACT

A steering device includes: a gripping detection unit that detects that a steering wheel of a vehicle is gripped, when a capacitance detection value detected using a sensor electrode provided in the steering wheel increases beyond a predetermined gripping detection threshold value; and a manipulation input detection unit that detects occurrence of a manipulation input to the steering wheel, when the capacitance detection value decreases below a manipulation input detection threshold value set to be higher than the gripping detection threshold value from a state in which the capacitance detection value is higher than the manipulation input detection threshold value, and then increases beyond the manipulation input detection threshold value again without decreasing below the gripping detection threshold value.

18 Claims, 7 Drawing Sheets

(56) References Cited

U.S. PATENT DOCUMENTS

| | | | |
|---|---|---|---|
| 2014/0118011 A1* | 5/2014 | Burger | G06F 1/3231 |
| | | | 324/676 |
| 2014/0232418 A1* | 8/2014 | Heim | H03K 17/955 |
| | | | 324/679 |
| 2016/0090103 A1* | 3/2016 | Tan | B60W 50/10 |
| | | | 345/156 |
| 2016/0285450 A1* | 9/2016 | Steffens | G01N 27/228 |
| 2016/0302730 A1* | 10/2016 | Odate | A61B 5/053 |
| 2017/0334477 A1* | 11/2017 | Bossler | B62D 1/046 |
| 2018/0087929 A1* | 3/2018 | Matsumura | B62D 1/06 |
| 2018/0106924 A1* | 4/2018 | Maeda | G01V 3/088 |
| 2021/0024097 A1* | 1/2021 | Jardine | B60W 40/105 |

\* cited by examiner

STEERING DEVICE

CROSS REFERENCE TO RELATED APPLICATIONS

This application is based on and claims priority under 35 U.S.C. § 119 to Japanese Patent Application 2018-215767, filed on Nov. 16, 2018, the entire contents of which are incorporated herein by reference.

TECHNICAL FIELD

This disclosure relates to a steering device.

BACKGROUND DISCUSSION

In the related art, there is a steering device which can detect a holding state of a steering wheel of a vehicle by a driver and detect occurrence of a manipulation input, using a sensor element provided in the steering wheel.

For example, JP 2013-79057A discloses a configuration which monitors a contact state between a first area serving as a gripping portion of the driver and a second area set above the first area to serve as a manipulation input unit, using a touch sensor provided in the steering wheel. Further, JP 2018-109852A discloses a configuration which three-dimensionally detects a change in a capacitance occurring on the outer surface of the gripping portion, using a capacitance sensor provided in the steering wheel. Further, in an example according to the related art, a part of a detection area by the capacitance sensor is covered with a conductor. A manipulation input is detected based on a change in a capacitance of the second area different from the first area covered by the conductor, so that high detection accuracy is ensured.

However, in a vehicle, all components are further improved. Even in the above-described steering device, since it cannot be said that a required level is always satisfied according to the above-described configuration of the related art, there is still a room for improvement in this point.

Thus, a need exists for a steering device which is not susceptible to the drawback mentioned above.

SUMMARY

A steering device according to an aspect of this disclosure includes a gripping detection unit that detects that a steering wheel of a vehicle is gripped, when a capacitance detection value detected using a sensor electrode provided in the steering wheel increases beyond a predetermined gripping detection threshold value, and a manipulation input detection unit that detects occurrence of a manipulation input to the steering wheel, when the capacitance detection value decreases below a manipulation input detection threshold value set to be higher than the gripping detection threshold value from a state in which the capacitance detection value is higher than the manipulation input detection threshold value, and then increases beyond the manipulation input detection threshold value again without decreasing below the gripping detection threshold value.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

Hereinafter, a first embodiment in which a vehicle steering device is embodied will be described with reference to the accompanying drawings.

Figure 1:
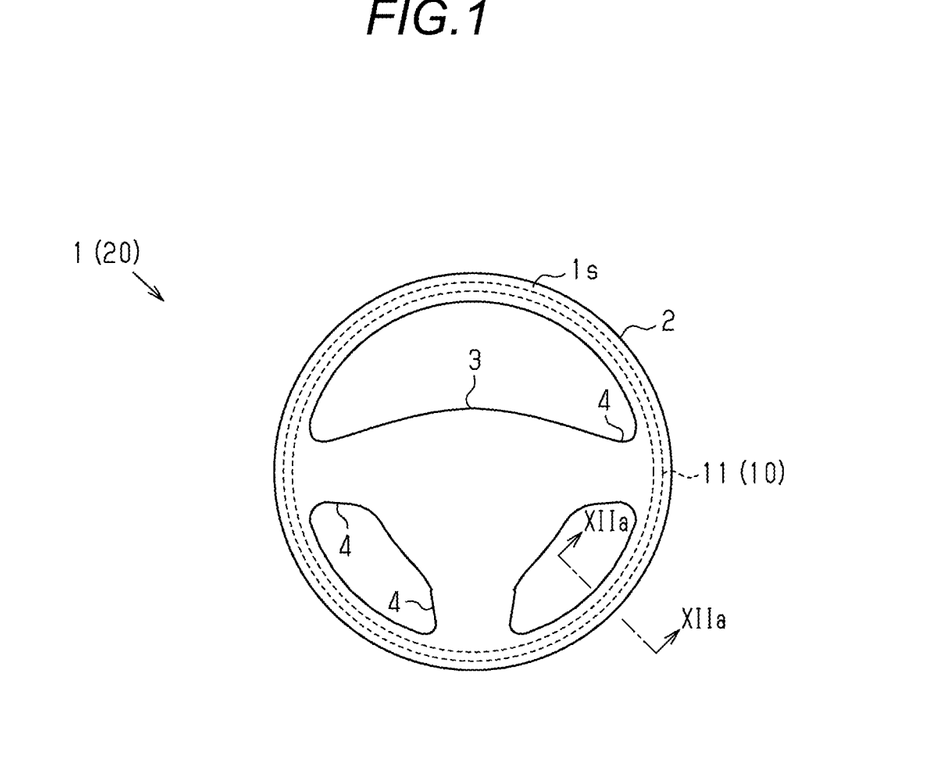
FIG. 1 is a front view of a steering wheel.

As illustrated in FIG. 1, a steering wheel 1 of the present embodiment includes a rim 2 that has a ring-shaped outer shape and is gripped by an occupant (the driver) of a vehicle, a hub 3 that is connected to a steering wheel shaft that is not illustrated, and three spokes 4 that connect the hub 3 and the rim 2 in a substantially T shape. In the steering wheel 1, a sensor electrode 11 of a capacitance sensor 10 is embedded in the rim 2.

In detail, in the steering wheel 1 of the present embodiment, the sensor electrode 11 is provided inside a skin 1s covering the outer surface thereof. Further, the sensor electrode 11 is routed in an extension direction of the steering wheel 1, specifically, in an extension direction of the annular rim 2, over substantially the entire area. In the present embodiment, a steering device 20, which can detect a gripping state of the steering wheel 1 by the driver and can detect a manipulation input, is formed using the sensor electrode 11.

Figure 2:
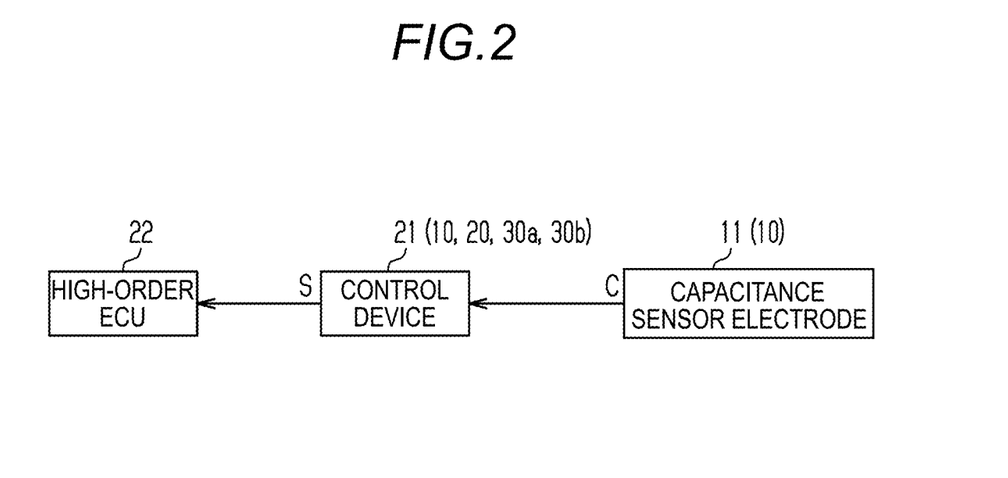
FIG. 2 is a block diagram illustrating a schematic configuration of a steering device.

Specifically, as illustrated in FIG. 2, an output signal of the sensor electrode 11 provided in the steering wheel 1 as described above is input to a control device 21 that forms the capacitance sensor 10 together with the sensor electrode 11. Further, the control device 21 monitors a change in a capacitance (detection value C) detected using the sensor electrode 11. Accordingly, the control device 21 of the present embodiment is configured to detect the gripping state of the steering wheel 1 by the driver and detect the manipulation input.

Further, the control device 21 of the present embodiment outputs, to a high-order ECU 22, a detection signal S indicating the detection results of the gripping state and the manipulation input. Accordingly, in a state in which the steering wheel 1 is gripped, the steering device 20 of the present embodiment is configured to enable manipulations of, for example, movable components (a wiper, a winker, a window regulator, and the like) of the vehicle, equipment (an air conditioner, an audio, and the like), or various driving support systems (a car navigation system, a lane keep assist system, and the like).

Figure 3:
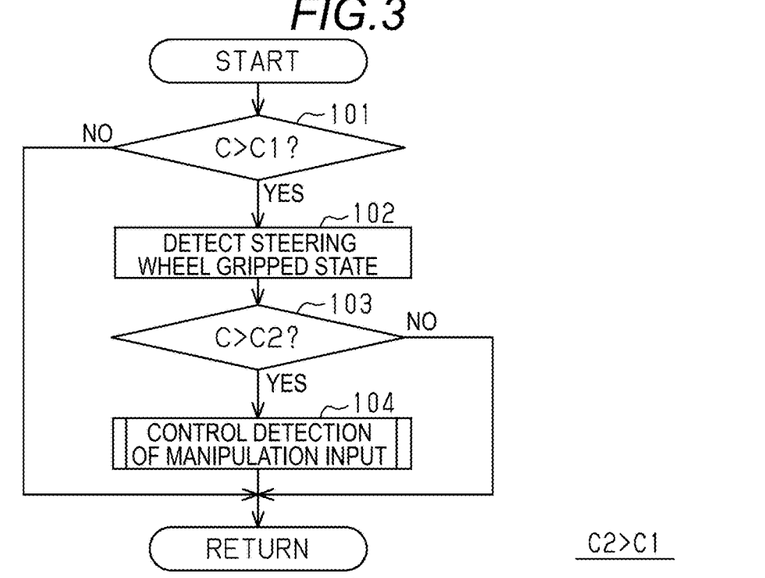
FIG. 3 is a flowchart illustrating a processing procedure of determining whether or not gripping state detection and manipulation input detection start.

In more detail, as illustrated in the flowchart of FIG. 3, the control device 21 of the present embodiment determines whether or not a capacitance detection value C detected using the sensor electrode 11 has increased beyond a predetermined gripping detection threshold value C1 (step 101). When the capacitance detection value C increases beyond the gripping detection threshold value C1, that is, is higher than the gripping detection threshold value C1 ($C>C1$, step 101: YES), it is detected that the steering wheel 1 is gripped (steering wheel gripped state is detected, step 102).

Further, the control device 21 of the present embodiment determines whether or not the capacitance detection value C is higher than a manipulation input detection threshold value C2 that is set to a value higher than the gripping detection threshold value C1 (step 103). When the capacitance detection value C is higher than the manipulation input detection threshold value C2 ($C>C2$, step 102: YES), control is performed to detect occurrence of the manipulation input to the steering wheel 1 (manipulation input detection control, step 104).

Figure 4:
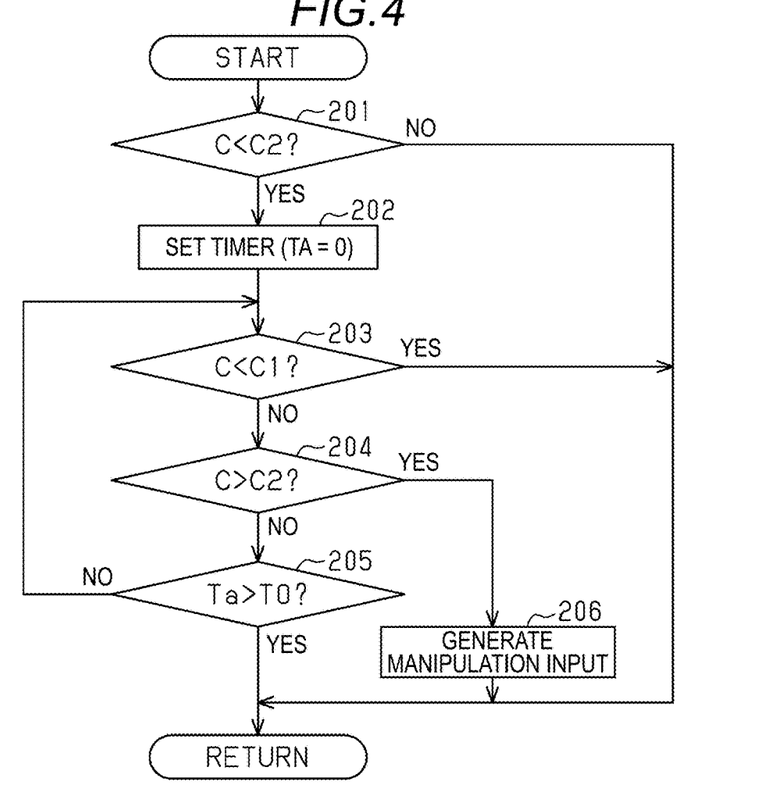
FIG. 4 is a flowchart illustrating a processing procedure of controlling the manipulation input detection.

In detail, as illustrated in the flowchart of FIG. 4, firstly, the control device 21 of the present embodiment determines whether or not the capacitance detection value C decreases below the manipulation input detection threshold value C2 (step 201) from a state in which the capacitance detection value C is higher than the manipulation input detection threshold value C2 that is, set to a value higher than the gripping detection threshold value C1 (see FIG. 3, step 103: YES). Further, in step 201, when the control device 21 determines that the capacitance detection value C decreases below the manipulation input detection threshold value C2, that is, the capacitance detection value C is lower than the manipulation input detection threshold value C2 ($C<C2$, step 201: YES), next, the control device 21 sets a timer for measuring a time ($Ta=0$, step 202). Further, the control device 21 determines whether or not the capacitance detection value C, which decreases below the manipulation input detection threshold value C2, is lower than the gripping detection threshold value C1 (step 203). When the capacitance detection value C is not less than the gripping detection threshold value C1 ($C≥C1$, step 203: NO) in step 203, the control device 21 determines whether or not the capacitance detection value C increases again beyond the manipulation input detection threshold value C2 (step 204).

When it is determined that the capacitance detection value C does not increase beyond the manipulation input detection threshold value C2 again in step 204 ($C≤C2$, step 204: NO), next, the control device 21 of the present embodiment determines whether or not a measurement time Ta by the timer set in step 202 exceeds a predetermined inversion detection time T0 (step 205). Further, when the measurement time Ta is equal to or less than the inversion detection time T0 in step 205 ($Ta≤T0$, step 205: NO), the control device 21 of the present embodiment performs the processing of steps 203 to 205 again. When it is determined in step 204 that the capacitance detection value C increases beyond the manipulation input detection threshold value C2 again ($C>C2$, step 204: YES), the control device 21 of the present embodiment detects the occurrence of the manipulation input to the steering wheel 1 (step 206).

Further, when it is determined in step 201 that the capacitance detection value C does not decrease below the manipulation input detection threshold value C2 ($C≥C2$, step 201: NO), the control device 21 of the present embodiment does not perform the processing of step 202 and subsequent steps. Further, when it is determined in step 203 that the capacitance detection value C is lower than the gripping detection threshold value C1 ($C<C1$, step 203: YES), the processing of step 204 and subsequent steps are not executed. When it is determined in step 205 that the measurement time Ta exceeds the inversion detection time T0 ($Ta>T0$, step 205: YES), the processing of step 203 and subsequent steps are not executed.

In this way, the control device 21 of the present embodiment determines whether or not the capacitance detection value C, which decreases below the manipulation input detection threshold value C2 (step 201: YES), is not lower than the gripping detection threshold value C1 (step 203: NO) within the inversion detection time T0 (step 205: NO), and increases beyond the manipulation input detection threshold value C2 again (step 201: YES). When it is determined that the manipulation input occurs if these conditions are satisfied, occurrence of a manipulation input of lightly tapping and pressing the steering wheel 1 with a finger or the like by the driver who grips the steering wheel 1, that is, a so-called tapping manipulation, can be detected.

Figure 5:
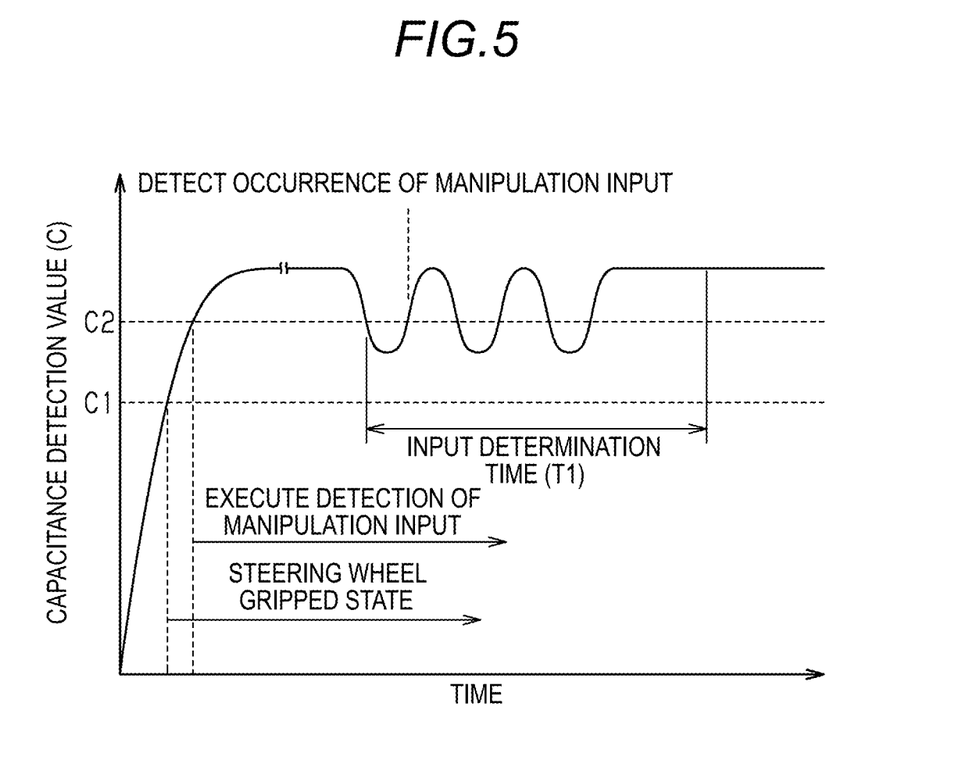
FIG. 5 is a graph for illustrating aspects of controlling the gripping state detection and the manipulation input detection.

That is, as illustrated in FIG. 5, as the driver grips the steering wheel 1, the capacitance detection value C detected using the sensor electrode 11 provided in the steering wheel 1 increases. Accordingly, as the capacitance detection value C increases beyond the gripping detection threshold value C1 (see FIG. 3, step 101: YES), it is detected that the driver is gripping the steering wheel 1 (step 102).

Further, as the driver continues to grip the steering wheel 1, the capacitance detection value C having increased beyond the gripping detection threshold value C1 is stabilized to be higher than the gripping detection threshold value C1. Further, in the steering device 20 of the present embodiment, the manipulation input detection threshold value C2 is set to a value that is lower than the capacitance detection value C stabilized as the gripping state continues. Accordingly, from a time point when the capacitance detection value C having increased beyond the gripping detection threshold value C1 as described above further exceeds the manipulation input detection threshold value C2 (step 103: YES), the occurrence of the manipulation input for the steering wheel 1 is detected (step 104).

In more detail, the tapping manipulation performed by the driver who grips the steering wheel 1 includes, for example, an operation of lifting, from the steering wheel 1, a finger or the like for performing the manipulation input. Accordingly, the capacitance detection value C detected using the sensor electrode 11 provided in the steering wheel 1 is lowered.

Further, the capacitance detection value C increases as the driver taps the steering wheel 1 with the finger lifted from the steering wheel 1, that is, as the finger having tapped and pressed the steering wheel 1 approaches the steering wheel 1 again. The control device 21 of the present embodiment monitors the capacitance detection value C by comparing the capacitance detection value C changed as such a tapping manipulation is executed with the above-described manipulation input detection threshold value C2 (see FIG. 4, step 201 and step 204), and is thus configured to detect the occurrence of the manipulation input.

Figure 6A:
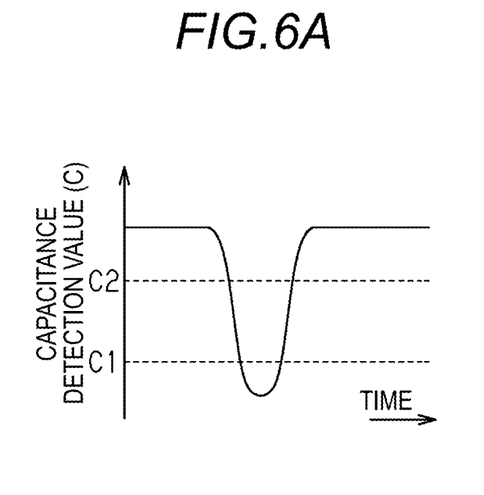
FIGS. 6A and 6B are graphs when occurrence of a manipulation input is denied (FIG. 6A: excessive decrease, and FIG. 6B: time over)

Here, as illustrated in FIG. 6A, for example, even when the driver instantaneously releases the driver's hand from the steering wheel 1 as in a change-over manipulation, the capacitance detection value C detected using the sensor electrode 11 provided in the steering wheel 1 decreases below the manipulation input detection threshold value C2, and then increases beyond the manipulation input detection threshold value C2 again. However, in the steering device 20 of the present embodiment, in this case, as the capacitance detection value C is lower than the gripping detection threshold value C1 (step 203: YES), the occurrence of the manipulation input is denied.

Figure 6B:
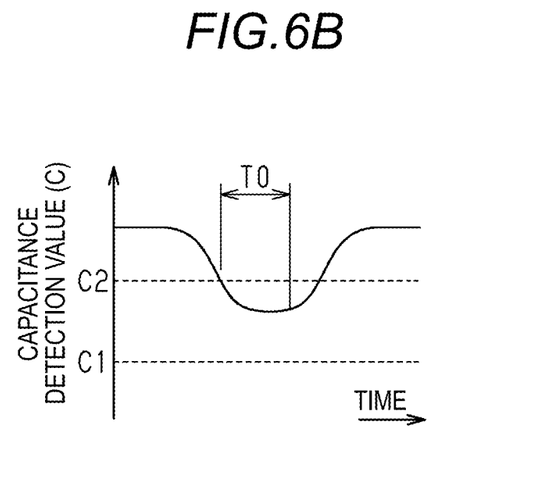

Further, as illustrated in FIG. 6B, for example, even when the driver who grips the steering wheel 1 lifts the driver's finger from the steering wheel 1 without intending the manipulation input, the capacitance detection value C decreases below the manipulation input detection threshold value C2, and then increases beyond the manipulation input detection threshold value C2 again. In this case, the capacitance detection value C may not be lower than the gripping detection threshold value C1 during that time.

However, even in this case, further, as the measurement time Ta exceeds the inversion detection time T0 from a time point when the capacitance detection value C decreases below the manipulation input detection threshold value C2 (step 205: YES), the occurrence of the manipulation input is denied. Accordingly, the control device 21 of the present embodiment can accurately detect the manipulation input performed by the driver who grips the steering wheel 1.

Further, as illustrated in FIG. 5, within a predetermined input determination time T1, the control device 21 of the present embodiment counts the number of times of "changes (manipulation input occurrence changes, see FIG. 4, step 201: YES, step 203: NO, step 204: YES, and step 205: NO) in the capacitance detection value C by which the occurrence of the manipulation input can be detected". The contents of the manipulation input performed on the steering wheel 1 are determined based on the counted number of times of changes.

Figure 7:
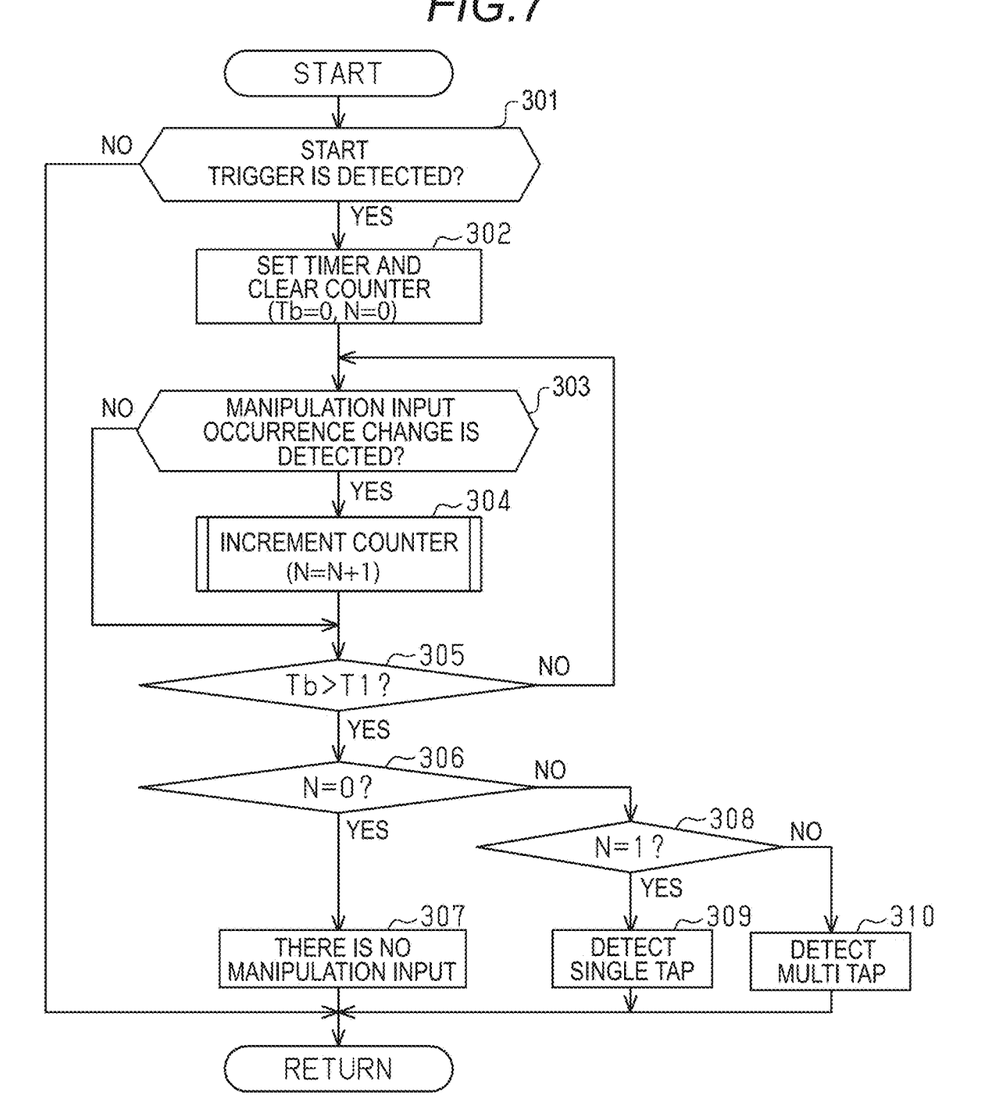
FIG. 7 is a flowchart illustrating a processing procedure of determining contents of the manipulation input based on counting of the manipulation input occurrence fluctuation.

In detail, as illustrated in the flowchart of FIG. 7, when detecting a start trigger for counting the manipulation input occurrence changes (step 301: YES), the control device 21 of the present embodiment firstly sets the timer for measuring a time or resets the count for measuring the number of times (Tb=0, N=0, step 302). Further, in the steering device 20 of the present embodiment, the "start trigger for counting the manipulation input occurrence changes", that is, a measurement start timing of the input determination time T1, is a timing when the capacitance detection value C firstly decreases below the manipulation input detection threshold value C2 from a state in which the capacitance detection value C is higher than the manipulation input detection threshold value C2. In the capacitance detection value C, when the above-described manipulation input occurrence changes are detected (step 303: YES), a counter is incremented (N=N+1, step 304).

Further, the control device 21 of the present embodiment determines whether or not a measurement time Tb by the timer set in step 302 exceeds the predetermined input determination time T1 (step 305). When the measurement time Tb is within the input determination time T1 (Tb≤T1, step 305: NO), the processing from step 303 to step 305 is executed again.

Further, when the measurement time Tb exceeds the input determination time T1 in step 305 (Tb>T1, step 305: YES), the control device 21 of the present embodiment firstly determines whether or not the count number N of the number of times of changes is "0" (step 306). When the count number N is "0" (N=0, step 306: YES), it is determined that there is no manipulation input to the steering wheel 1 (no manipulation input, step 307).

Further, when the count number N is not "0" (N≠0, step 306: NO), the control device 21 continuously determines that the count number N of the number of times of changes is "1" (step 308). When the count number N is "1" (N=1, step 308: YES), it is determined that the manipulation input to the steering wheel 1 is a single tap (a manipulation of performing pressing once) (step 309). When the count number N is not "1" (N≠1, step 308: NO), it is determined that the manipulation input is a multi-tap (step 310).

Further, when the manipulation input occurrence changes are not detected in step 303 (step 303: NO), the control device 21 of the present embodiment does not execute the processing of step 304. When it is determined in step 310 that the manipulation input is the multi-tap, the multi-tap is recognized as a "double tap (a manipulation of performing pressing twice)".

Next, the effect of the present embodiment will be described.

(1) When the capacitance detection value C detected using the sensor electrode 11 provided in the steering wheel 1 increases beyond the predetermined gripping detection threshold value C1 (C>C1, step 101: YES), the control device 21 as a gripping detection unit 30a detects that the steering wheel 1 is gripped (step 102). Further, from a state in which the capacitance detection value C is higher than the manipulation input detection threshold value C2 set to a value higher than the gripping detection threshold value C1 (C>C2, step 103: YES), the control device 21 as a manipulation input detection unit 30b determines whether or not the capacitance detection value C decreases below the manipulation input detection threshold value C2. In the case after the capacitance detection value C decreases below the manipulation input detection threshold value C2 (C<C2, step 201: YES), the capacitance detection value C is not lower than the gripping detection threshold value C1 (C≥C1, step 203: NO), and the capacitance detection value C increases beyond the manipulation input detection threshold value C2 again (C>C2, step 204: YES), the occurrence of the manipulation input to the steering wheel 1 is detected.

That is, as the driver grips the steering wheel 1, the capacitance detection value C detected using the sensor electrode 11 provided in the steering wheel 1 increases. Further, a so-called tapping manipulation of lightly tapping and pressing the steering wheel 1 by the driver who grips the steering wheel 1 includes, for example, an operation of lifting up the finger or the like which performs the manipulation input from the steering wheel 1. Therefore, the capacitance detection value C decreases once due to this fact, and then increases again as a portion (such as the finger) that taps and presses the steering wheel 1 approaches the steering wheel 1. Thus, according to the configuration, the manipulation input performed in a state in which the steering wheel 1 is gripped can be detected with a simple structure. Further, the gripping state and the occurrence of the manipulation input can be detected at any gripping position where the sensor electrode 11 is routed. Accordingly, improved convenience can be achieved.

Further, for example, when the capacitance detection value C is lowered by the driver instantaneously releasing the driver's hand from the steering wheel 1 as in the change-over manipulation or the like, the capacitance detection value C is lower than the gripping detection threshold value C1, so that the occurrence of the manipulation input is denied. Accordingly, detection accuracy of the manipulation input can be improved.

(2) The control device 21 detects the occurrence of the manipulation input when the capacitance detection value C having decreased below the manipulation input detection threshold value C2 increases beyond the manipulation input detection threshold value C2 again within the predetermined inversion detection time T0 (step 205: NO).

That is, for example, even when the driver who grips the steering wheel 1 lifts the driver's finger from the steering wheel 1 without intending the manipulation input, the capacitance detection value C decreases below the manipulation input detection threshold value C2, and then increases beyond the manipulation input detection threshold value C2 again. In this case, the capacitance detection value C may not be lower than the gripping detection threshold value C1 during that time. However, even in such a case, as the inversion detection time T0 has elapsed (step 205: YES), the occurrence of the manipulation input is denied. Thus, according to the above-described configuration, it is possible to accurately detect the manipulation input performed by the driver who grips the steering wheel 1.

(3) the control device 21 determines the contents of the manipulation input (step 306 to step 310) by counting the number N of times of changes in which the occurrence of the manipulation input occurring in the capacitance detection value C can be detected (step 303: YES, step 304) within the predetermined input determination time T1. Accordingly, a plurality of types of manipulation inputs can be distinguished and detected with a simple configuration.

Second Embodiment

Hereinafter, a second embodiment in which a vehicle steering device is embodied will be described with reference to the accompanying drawings. Further, for convenience of description, the same components as those in the first embodiment are designated by the same reference numerals, and description thereof will be omitted.

Figure 8:
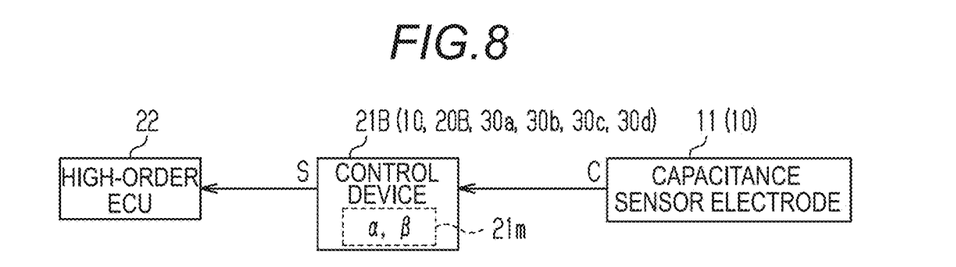
FIG. 8 is a block diagram illustrating a schematic configuration of a steering device according to a second embodiment.
Figure 9:
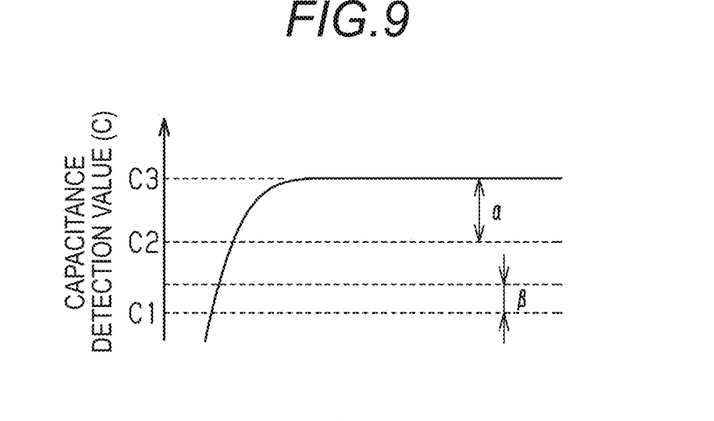
FIG. 9 is a graph illustrating an aspect of setting a gripping detection state value and setting a manipulation input detection threshold value based on the gripping detection state value.

As illustrated in FIGS. 8 and 9, in a steering device 20B of the present embodiment, a control device 21B sets a gripping detection state value C3 based on the capacitance detection value C having increased beyond the gripping detection threshold value C1 as the driver grips the steering wheel 1. The control device 21B of the present embodiment is configured to set the manipulation input detection threshold value C2 based on the gripping detection state value C3 and the gripping detection threshold value C1.

In detail, the control device 21B as a gripping detection state value setting unit 30c sets an average value of the capacitance detection value C for the predetermined time as the gripping detection state value C3 when the capacitance detection value C having increased beyond the gripping detection threshold value C1 as the driver continues to grip the steering wheel 1 is stable in a state of being higher than the gripping detection threshold value C1.

Further, in this case, the "stable state determination" is determined based on whether or not a change width of the capacitance detection value C is within a predetermined range. The control device 21B of the present embodiment is configured to frequently update the gripping detection state value C3 by using a moving average as the "average value for the predetermined time" in this case.

Further, the control device 21B of the present embodiment holds setting reference values α and β in a storage area 21m. The control device 21B as a manipulation input detection threshold value setting unit 30d is configured to use these setting reference values α and β for setting the manipulation input detection threshold value C2.

Figure 10:
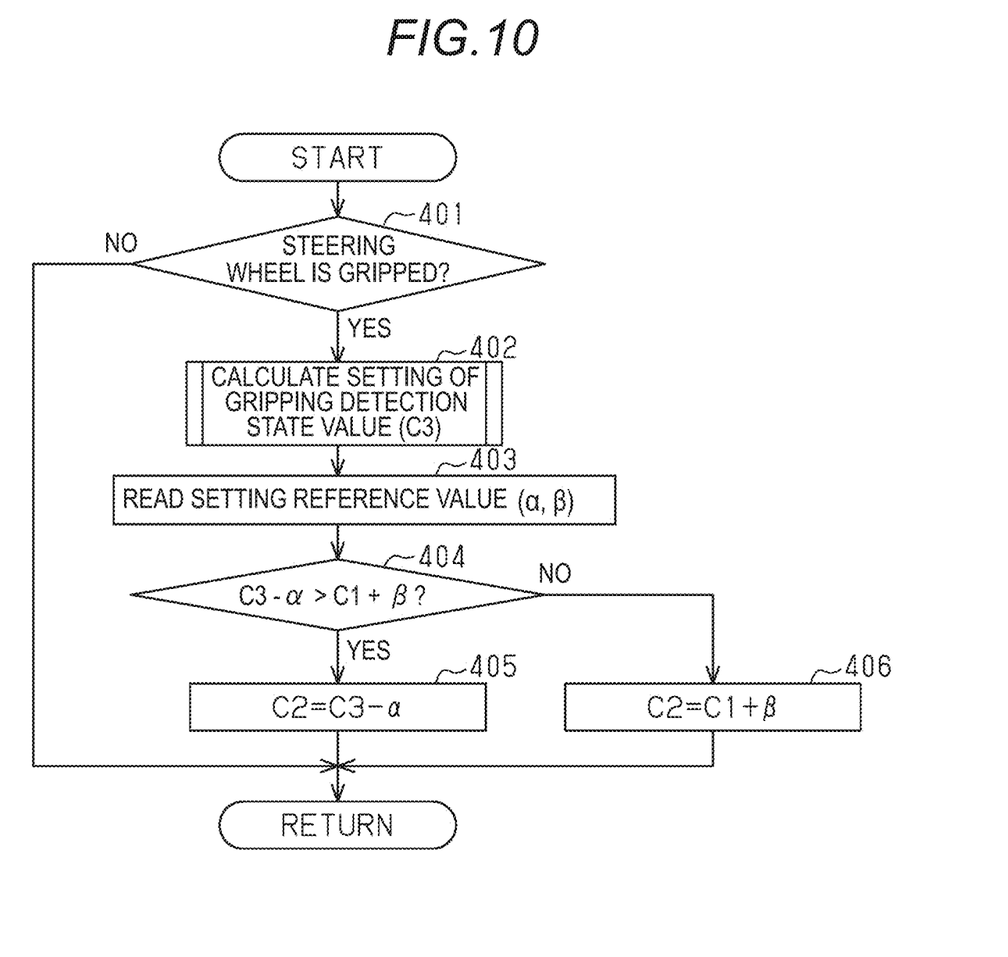
FIG. 10 is a flowchart illustrating a processing procedure of setting the gripping detection state value and setting the manipulation input detection threshold value based on the gripping detection state value.

In detail, as illustrated in the flowchart of FIG. 10, the control device 21B of the present embodiment detects that the driver is in a state of gripping the steering wheel 1 (step 401: YES, see FIG. 3, step 102), to execute a setting operation of the gripping detection state value C3 (step 402).

Next, the control device 21B reads the setting reference values α and β from the storage area 21m (step 403), and determines whether or not a value (C3−α) obtained by subtracting the first setting reference value α from the gripping detection state value C3 is larger than a value (C1+β) obtained by adding the second setting reference value β to the gripping detection threshold value C1 (step 404). When the value obtained by subtracting the first setting reference value α from the gripping detection state value C3 is larger than the value obtained by adding the second setting reference value β to the gripping detection threshold value C1 (C3−α>C1+β, step 404: YES), the value obtained by subtracting the first setting reference value α from the gripping detection state value C3 is set as the manipulation input detection threshold value C2 (C2=C3−α, step 405).

Meanwhile, when the value obtained by subtracting the first setting reference value α from the gripping detection state value C3 is equal to or lower than the value obtained by adding the second setting reference value β to the gripping detection threshold value C1 in step 404 (C3−αC1+β, step 404: NO), the value obtained by adding the second setting reference value β to the gripping detection threshold value C1 is set as the manipulation input detection threshold value C2 (C2=C1+β, step 406). In the steering device 20B of the present embodiment, for example, the first setting reference value α is set to a value (for example, one quantity) corresponding to a change in the capacitance when the finger is lifted from the steering wheel 1 such that the driver who grips the steering wheel 1 performs the manipulation input. The control device 21B of the present embodiment is configured to detect the occurrence of the manipulation input using the manipulation input detection threshold value C2 set in step 405 or step 406 (see FIG. 4).

Hereinabove, according to the configuration of the present embodiment, it is possible to accurately detect the occurrence of the manipulation input regardless of an individual difference between the drivers who grip the steering wheel 1.

The above-described embodiment can be implemented with the following changes. The above-described embodiment and the following modifications can be implemented in combination with each other without technical inconsistency.

In each of the above-described embodiments, in the predetermined input determination time T1, the number of times of "changes at which the occurrence of the manipulation input can be detected (the manipulation input occurrence change, see FIG. 4)" having occurred in the capacitance detection value C is counted. The content (the single tap and the multi-tap) of the manipulation input is determined based on the counted number of times of the changes.

Figure 11:
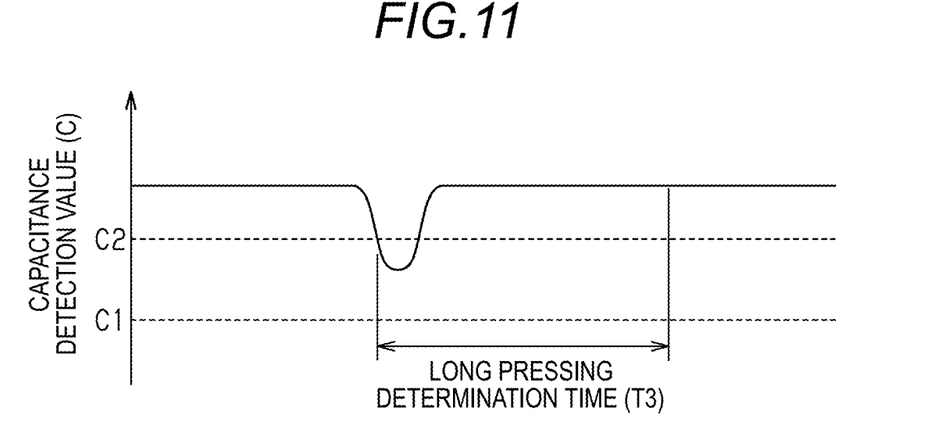
FIG. 11 is a graph illustrating another aspect of determining contents of the manipulation input (long pressing determination)

However, the embodiment is not limited thereto. As illustrated in FIG. 11, when the capacitance detection value C, increasing beyond the manipulation input detection threshold value C2 again after having decreased below the manipulation input detection threshold value C2, does not decrease below the manipulation input detection threshold value C2 within a predetermined long pressing determination time T3 again, the manipulation input may be determined as a "long pressing manipulation". Accordingly, a plurality of types of manipulation inputs can be distinguished and detected with a simple configuration.

In this case, the long pressing determination time T3 may be set to the same length as the input determination time T1 or a different length (for example, shorter than the input determination time T1). Further, as illustrated in FIG. 11, measurement of the long pressing determination time T3 starts from the time point when the capacitance detection value C decreases below the manipulation input detection threshold value C2. However, for example, measurement start timing of the long pressing determination time T3 may be changed in a predetermined manner, for example, the measurement starts from a time point when the capacitance detection value C increases beyond the manipulation input detection threshold value C2 again. With regard to a general "one-tap manipulation" when such a "long pressing manipulation" is detected, for example, the capacitance detection value C, increasing beyond the manipulation input detection threshold value C2 after having decreased below the manipulation input detection threshold value C2, decreases below the manipulation input detection threshold value C2 again within the long pressing determination time T3. This case may be added as a determination condition for the "long pressing manipulation".

In each of the above-described embodiments, measurement of the inversion detection time T0 starts from the time point when the capacitance detection value C decreases below the manipulation input detection threshold value C2. However, for example, when the capacitance detection value C that is higher than the manipulation input detection threshold value C2 decreases by a predetermined value or more, the measurement starts. In this way, the measurement start timing of the inversion detection time T0 may be also changed in a predetermined manner.

Further, such an inversion detection time T0 may not be set. That is, the "manipulation input occurrence change (step 201: YES, step 203: NO, and step 204: YES)" may be detected without providing a time limit (see FIG. 4, step 205) having the inversion detection time T0 as an upper limit.

Further in each of the above-described embodiments, a timing when the capacitance detection value C firstly decreases below the manipulation input detection threshold value C2 is set as the start trigger for counting the manipulation input occurrence changes, that is, the measurement start timing of the input determination time T1. However, this timing may be also changed in a predetermined manner, which is like the measurement start timing of the inversion detection time T0 and the long pressing determination time T3.

In the second embodiment, in the setting calculation of the gripping detection state value C3 (see FIG. 10, step 402), the "stable state determination" of the capacitance detection value C is executed depending on whether or not a change width of the capacitance detection value C is within a predetermined range. In this case, the gripping detection state value C3 is set by calculating a moving average of the capacitance detection value C.

However, the embodiment is not limited. For example, simply, the moving average of the capacitance detection value C may be set to the gripping detection state value C3 or a value immediately before the "change at which the occurrence of the manipulation input can be detected" occurs, for example, a value immediately before the capacitance detection value C that is higher than the manipulation input detection threshold value C2 decreases by a predetermined value, may be set to the gripping detection state value C3. Further, an initial setting value until the gripping detection state value C3 is firstly calculated may be provided. The setting calculation for the gripping detection state value C3 may be periodically performed or the value may be held until the gripping state of the steering wheel 1 by the driver is released after the gripping detection state value C3 is firstly calculated.

Further, in the second embodiment, the control device 21B holds the setting reference values $\alpha$ and $\beta$ in the storage area 21m. The control device 21B as the manipulation input detection threshold value setting unit 30d sets, as the manipulation input detection threshold value C2, any one (the larger one) of the value (C3−$\alpha$) obtained by subtracting the first setting reference value $\alpha$ from the gripping detection state value C3 and the value (C1+$\beta$) obtained by adding the second setting reference value $\beta$ to the gripping detection threshold value C1. However, the embodiment is not limited thereto. For example, a difference (C3−C1) between the gripping detection state value C3 and the gripping detection threshold value C1 is obtained, and a value obtained by multiplying the difference by a predetermined coefficient (<1.0) is added to the gripping detection threshold value C1 (or is subtracted from the gripping detection state value C3), so that the manipulation input detection threshold value C2 may be calculated.

In each of the above-described embodiments, the steering wheel 1 includes the rim 2 having a ring-shaped outer shape. The rim 2 is held by the occupant (the driver) of the vehicle. However, the embodiment is not limited thereto. For example, the shape of the gripping portion by the occupant, such as a so-called butterfly type, may be changed in a predetermined manner.

In each of the above-described embodiments, the sensor electrode 11 is routed in the extension direction of the steering wheel 1. However, the sensor electrode 11 may not be necessarily routed over the entire area in the extension direction. Further, a plurality of the sensor electrodes 11 may be provided in the steering wheel 1. Arrangement of the sensor electrodes 11 may be changed in a predetermined manner.

Figure 12A:
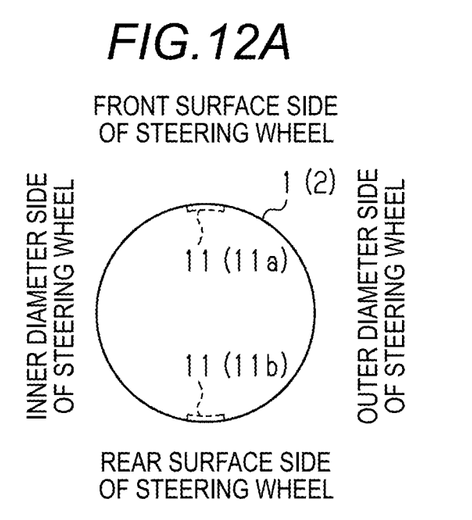
FIGS. 12A to 12C are diagrams illustrating other examples of arrangement of sensor electrodes.
Figure 12B:
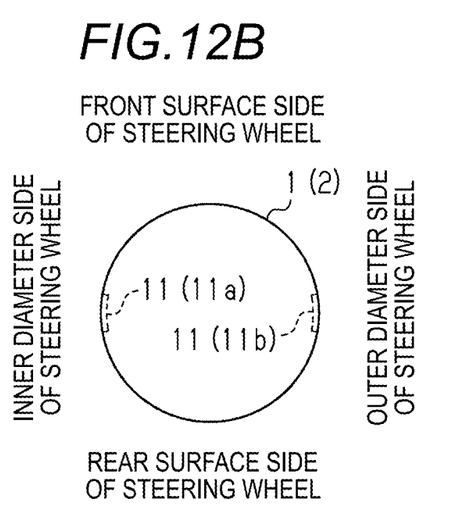
Figure 12C:
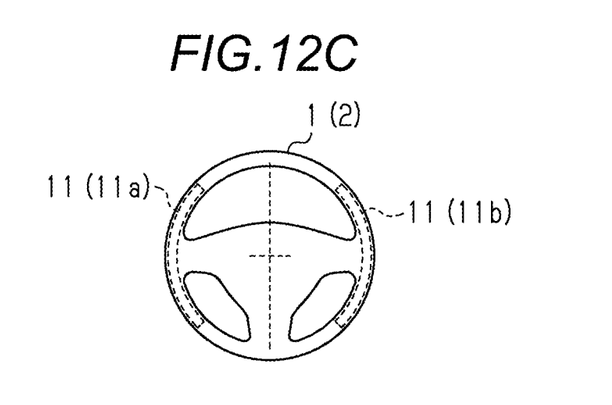

As illustrated in FIG. 12A, for example, the sensor electrodes 11 may be routed on the front surface side (in FIG. 1, the front side of the paper) and the rear surface side (the rear side of the page) of the steering wheel 1 on the outer peripheral edge of a perpendicular cross section to the extension direction of the steering wheel 1 (see FIG. 1, the extension direction of the annular rim 2). Further, as illustrated in FIG. 12B, the sensor electrodes 11 may be routed on an inner diameter side and an outer diameter side of the steering wheel 1 on the outer peripheral edge of the perpendicular cross section. Further, as illustrated in FIG. 12C, the sensor electrodes 11 may be routed on the right and left sides of the steering wheel 1. The sensor electrodes 11 may be arranged on at least any one of the front surface side and the rear surface side and on at least any one of the inner diameter side and the outer diameter side on the outer peripheral edge of the perpendicular cross section. Further, for example, the sensor electrodes 11 may be arranged at the vertical position of the steering wheel 1 or may be arranged at the vertical position in combination with the right-left position of the steering wheel 1. The sensor electrodes 11 provided in the steering wheel 1 may form one detection channel or may form independent detection channels, respectively.

Further, in a configuration in which the plurality of sensor electrodes 11 forming the independent detection channels are provided in the steering wheel 1, the sensor electrodes 11 may function as a first electrode and a second electrode provided independently.

For example, in an example illustrated in FIG. 12A, one of the sensor electrodes 11 provided on the front surface side and the rear surface side of the steering wheel 1 on the outer peripheral edge of the perpendicular cross section is set to a first electrode 11a and the other sensor electrode 11 is set to a second electrode 11b. Further, for example, in an example illustrated in FIG. 12B, one of the sensor electrodes 11 provided on the inner diameter side and the outer diameter side of the steering wheel 1 on the outer peripheral edge of the perpendicular cross section is set to the first electrode 11a and the other sensor electrode 11 is set to the second electrode 11b. Further, in an example illustrated in FIG. 12C, one of the sensor electrodes 11 provided on the right and left sides of the steering wheel 1 is set to the first electrode 11a and the other sensor electrode 11 is set to the second electrode 11b. In the first electrode 11a and the second electrode 11b, the occurrence of the manipulation input is determined by monitoring the "manipulation input occurrence change by which the occurrence of the manipulation input can be detected", which occurs in the capacitance detection value C.

Figure 13:
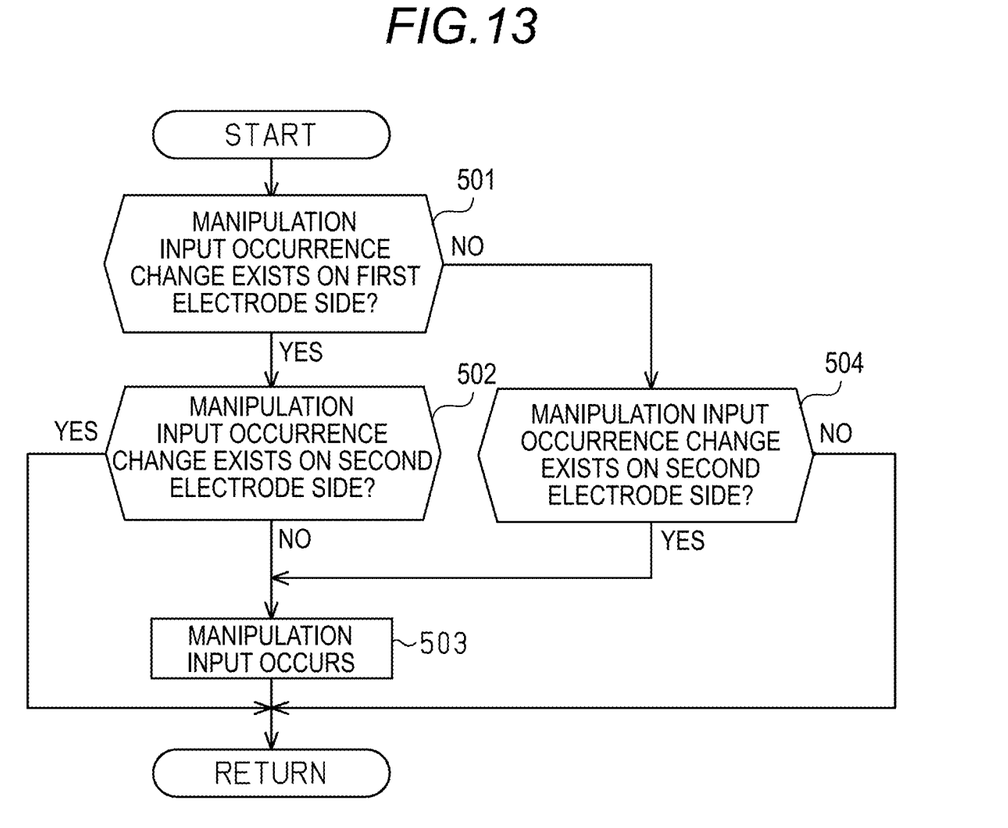
FIG. 13 is a flowchart illustrating another processing procedure of controlling the manipulation input detection.

For example, as illustrated in the flowchart of FIG. 13, firstly, it is determined whether or not the manipulation input occurrence change (see FIG. 4) at which the occurrence of the manipulation input can be detected exists on the first electrode 11a side (step 501). Further, when the manipulation input occurrence changes exist on the first electrode 11a side (step 501: YES), it is determined whether or not the manipulation input occurrence change exists on the second electrode 11b (step 502). When the manipulation input occurrence change does not exist on the second electrode 11b in step 502 (step 502: NO), it is determined that the manipulation input to the steering wheel 1 occurs (step 503).

Further, even when the manipulation input occurrence change does not exist on the first electrode 11a side in step 501 (step 501: NO), continuously, it is determined whether or not the manipulation input occurrence change exists on the second electrode 11b side (step 504). Even when the manipulation input occurrence change exists on the second electrode 11b side in step 504 (step 504: YES), it may be determined in step 503 that the manipulation input to the steering wheel 1 occurs.

That is, when the tapping manipulation is performed in a state in which the steering wheel 1 is gripped, a portion separated from the steering wheel 1 and a portion in contact with the steering wheel 1 are formed on hands of the driver to perform the tapping manipulation (for example, a finger and a palm or a right hand and a left hand). In consideration of this point, as described above, when the manipulation input occurrence change on the capacitance detection value C exists on one of the first electrode 11a and the second electrode 11b and the manipulation input occurrence change does not exist on the other one thereof, it is determined that the manipulation input occurs. Accordingly, the occurrence of the manipulation input to the steering wheel 1 can be detected more accurately.

Even in this case, the arrangement of the first electrode 11a and the second electrode 11b and the number of components thereof may be changed in a predetermined manner. A configuration may be provided in which only when the manipulation input occurrence change exists on the first electrode 11a side and the manipulation input occurrence change does not exist on the second electrode 11b side, the occurrence of the manipulation input is detected or only when the manipulation input occurrence change exists on the second electrode 11b side and the manipulation input occurrence change does not exist on the first electrode 11a side, the occurrence of the manipulation input is detected. Accordingly, when a mode of the tapping manipulation is specified in advance, that is, when the portion separated from the steering wheel 1 and the portion in contact with the steering wheel 1 are known, the occurrence of the manipulation input can be detected more accurately.

Figure 14:
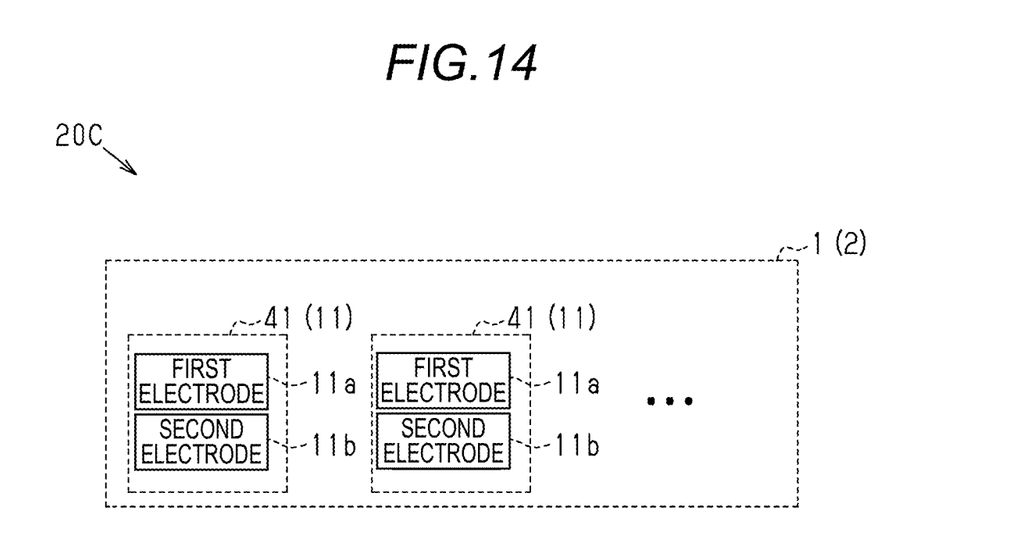
FIG. 14 is a block diagram illustrating another schematic configuration of a steering device.

Further, as in the steering device 20C illustrated in FIG. 14, the first electrode 11a and the second electrode 11b may be provided as an electrode pair 41, and a plurality of the electrode pairs 41 may be provided in the steering wheel 1 (the rim 2). As the electrode pairs 41 are used as independent sensor electrodes 11, respectively, the manipulation input can be detected with high accuracy.

A steering device according to an aspect of this disclosure includes a gripping detection unit that detects that a steering wheel of a vehicle is gripped, when a capacitance detection value detected using a sensor electrode provided in the steering wheel increases beyond a predetermined gripping detection threshold value, and a manipulation input detection unit that detects occurrence of a manipulation input to the steering wheel, when the capacitance detection value decreases below a manipulation input detection threshold value set to be higher than the gripping detection threshold value from a state in which the capacitance detection value is higher than the manipulation input detection threshold value, and then increases beyond the manipulation input detection threshold value again without decreasing below the gripping detection threshold value.

That is, as the driver grips the steering wheel, the capacitance detection value detected using the sensor electrode provided in the steering wheel increases. Further, a tapping manipulation of lightly tapping and pressing the steering wheel by the driver who grips the steering wheel includes, for example, an operation of lifting up the finger or the like which performs the manipulation input from the steering wheel. Therefore, the capacitance detection value decreases once due to this fact, and then increases again as a portion (such as the finger) that taps and presses the steering wheel approaches the steering wheel. Thus, according to the configuration, the manipulation input performed in a state in which the steering wheel is gripped can be detected with a simple structure. Further, the gripping state and the occurrence of the manipulation input can be detected at any gripping position where the sensor electrode is routed. Accordingly, improved convenience can be achieved.

Further, for example, when the capacitance detection value is lowered by the driver instantaneously releasing the driver's hand from the steering wheel as in the change-over manipulation or the like, the capacitance detection value is lower than the gripping detection threshold value, so that the occurrence of the manipulation input is denied. Accordingly, detection accuracy of the manipulation input can be improved.

It is preferable that the steering device according to the aspect of this disclosure further includes a gripping detection state value setting unit that sets a gripping detection state value based on the capacitance detection value increasing beyond the gripping detection threshold value, and a manipulation input detection threshold value setting unit that sets the manipulation input detection threshold value, based on the gripping detection state value and the gripping detection threshold value. In the steering device according to the aspect of this disclosure, it is preferable that the gripping state value setting unit sets an average value of the capacitance detection value for a predetermined time as the gripping detection state value when the capacitance detection value increasing beyond the gripping detection threshold value is stable in a state of being higher than the gripping detection threshold value. In the steering device according to the aspect of this disclosure, it is preferable that the gripping state value setting unit determines whether or not the capacitance detection value is stable in the state of being higher than the gripping detection threshold value, based on whether or not a change range of the capacitance detection value is within a predetermined value. In the steering device according to the aspect of this disclosure, it is preferable that the manipulation input detection threshold value setting unit sets, as the manipulation input detection threshold value, the larger one of a value obtained by subtracting a predetermined first setting reference value from the gripping detection state value and a value obtained by adding a predetermined second setting reference value to the gripping detection threshold value. In the steering device according to the aspect of this disclosure, it is preferable that the first setting reference value is set to a value corresponding to a change in a capacitance when a driver gripping the steering wheel lifts up the driver's finger from the steering wheel to perform the manipulation input. In the steering device according to the aspect of this disclosure, it is preferable that the manipulation input detection threshold value setting unit obtains a difference between the gripping detection state value and the gripping detection threshold value, and sets the manipulation input detection threshold value by adding a value obtained by multiplying the difference by a predetermined coefficient to the gripping detection threshold value or subtracting the value from the gripping detection state value.

According to the configuration, it is possible to accurately detect the occurrence of the manipulation input regardless of an individual difference between the drivers who grip the steering wheel.

In the steering device according to the aspect of this disclosure, it is preferable that the manipulation input detection unit detects the occurrence of the manipulation input, when the capacitance detection value having decreased below the manipulation input detection threshold value increases beyond the manipulation input detection threshold value again within a predetermined inversion detection time.

That is, for example, even when the driver who grips the steering wheel lifts the driver's finger from the steering wheel without intending the manipulation input, the capacitance detection value decreases below the manipulation input detection threshold value, and then increases beyond the manipulation input detection threshold value again. In this case, the capacitance detection value may not be lower than the gripping detection threshold value during that time. However, even in such a case, as the inversion detection time has elapsed, the occurrence of the manipulation input is denied. Thus, according to the above-described configuration, it is possible to accurately detect the manipulation input performed by the driver who grips the steering wheel.

In the steering device according to the aspect of this disclosure, it is preferable that the manipulation input detection unit determines contents of the manipulation input by counting the number of times of changes at which the occurrence of the manipulation input occurring in the capacitance detection value is detected within a predetermined input determination time.

According to the configuration, a plurality of types of manipulation inputs can be distinguished and detected with a simple configuration.

In the steering device according to the aspect of this disclosure, it is preferable that the manipulation input detection unit determines that the manipulation input is a long pressing manipulation when the capacitance detection value, increasing beyond the manipulation input detection threshold value again after having decreased below the manipulation input detection threshold value, does not decrease below the manipulation input detection threshold value again within a predetermined long pressing determination time.

According to the configuration, a plurality of types of manipulation inputs can be distinguished and detected with a simple configuration.

In the steering device according to the aspect of this disclosure, it is preferable that the sensor electrode includes a first electrode and a second electrode provided independently, and the manipulation input detection unit determines that the manipulation input occurs, when a change in the capacitance detection value by which the occurrence of the manipulation input is detected exists on one of the first electrode and the second electrode and the change in the capacitance detection value by which the occurrence of the manipulation input is detected does not exist on the other one of the first electrode and the second electrode.

That is, when the tapping manipulation is performed in a state in which the steering wheel is gripped, a portion (for example, a finger) separated from the steering wheel and a portion (for example, a palm) in contact with the steering wheel may be formed on hands of the driver to perform the tapping manipulation. Thus, according to the configuration, occurrence of the manipulation input to the steering wheel can be detected more accurately.

In the steering device according to the aspect of this disclosure, it is preferable that the first electrode and the second electrode are used as an electrode pair, and a plurality of the electrode pairs are provided in the steering wheel.

According to the configuration, as the electrode pairs are used as independent sensor electrodes, respectively, the manipulation input can be detected with high accuracy.

According to the aspect of this disclosure, convenience can be improved with a simple configuration.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A steering device comprising:
   a gripping detection unit that detects that a steering wheel of a vehicle is gripped, when a capacitance detection value detected using a sensor electrode provided in the steering wheel increases beyond a predetermined gripping detection threshold value; and a manipulation input detection unit that detects occurrence of a manipulation input to the steering wheel, when the capacitance detection value decreases below a manipulation input detection threshold value set to be higher than the gripping detection threshold value from a state in which the capacitance detection value is higher than the manipulation input detection threshold value, and then increases beyond the manipulation input detection threshold value again without decreasing below the gripping detection threshold value.

2. The steering device according to claim 1, further comprising:

a gripping detection state value setting unit that sets a gripping detection state value based on the capacitance detection value increasing beyond the gripping detection threshold value; and a manipulation input detection threshold value setting unit that sets the manipulation input detection threshold value, based on the gripping detection state value and the gripping detection threshold value.

3. The steering device according to claim 2, wherein the gripping state value setting unit sets an average value of the capacitance detection value for a predetermined time as the gripping detection state value when the capacitance detection value increasing beyond the gripping detection threshold value is stable in a state of being higher than the gripping detection threshold value.

4. The steering device according to claim 3, wherein the gripping state value setting unit determines whether or not the capacitance detection value is stable in the state of being higher than the gripping detection threshold value, based on whether or not a change range of the capacitance detection value is within a predetermined value.

5. The steering device according to claim 2, wherein the manipulation input detection threshold value setting unit sets, as the manipulation input detection threshold value, the larger one of a value obtained by subtracting a predetermined first setting reference value from the gripping detection state value and a value obtained by adding a predetermined second setting reference value to the gripping detection threshold value.

6. The steering device according to claim 5, wherein the first setting reference value is set to a value corresponding to a change in a capacitance when a driver gripping the steering wheel lifts up the driver's finger from the steering wheel to perform the manipulation input.

7. The steering device according to claim 2, wherein the manipulation input detection threshold value setting unit obtains a difference between the gripping detection state value and the gripping detection threshold value, and sets the manipulation input detection threshold value by adding a value obtained by multiplying the difference by a predetermined coefficient to the gripping detection threshold value or subtracting the value from the gripping detection state value.

8. The steering device according to claim 1, wherein the manipulation input detection unit detects the occurrence of the manipulation input, when the capacitance detection value having decreased below the manipulation input detection threshold value increases beyond the manipulation input detection threshold value again within a predetermined inversion detection time.

9. The steering device according to claim 2, wherein the manipulation input detection unit detects the occurrence of the manipulation input, when the capacitance detection value having decreased below the manipulation input detection threshold value increases beyond the manipulation input detection threshold value again within a predetermined inversion detection time.

10. The steering device according to claim 1, wherein the manipulation input detection unit determines contents of the manipulation input by counting the number of times of changes at which the occurrence of the manipulation input occurring in the capacitance detection value is detected within a predetermined input determination time.

11. The steering device according to claim 2, wherein the manipulation input detection unit determines contents of the manipulation input by counting the number of times of changes at which the occurrence of the manipulation input occurring in the capacitance detection value is detected within a predetermined input determination time.

12. The steering device according to claim 8, wherein the manipulation input detection unit determines contents of the manipulation input by counting the number of times of changes at which the occurrence of the manipulation input occurring in the capacitance detection value is detected within a predetermined input determination time.

13. The steering device according to claim 1, wherein the manipulation input detection unit determines that the manipulation input is a long pressing manipulation when the capacitance detection value, increasing beyond the manipulation input detection threshold value again after having decreased below the manipulation input detection threshold value, does not decrease below the manipulation input detection threshold value again within a predetermined long pressing determination time.

14. The steering device according to claim 2, wherein the manipulation input detection unit determines that the manipulation input is a long pressing manipulation when the capacitance detection value, increasing beyond the manipulation input detection threshold value again after having decreased below the manipulation input detection threshold value, does not decrease below the manipulation input detection threshold value again within a predetermined long pressing determination time.

15. The steering device according to claim 8, wherein the manipulation input detection unit determines that the manipulation input is a long pressing manipulation when the capacitance detection value, increasing beyond the manipulation input detection threshold value again after having decreased below the manipulation input detection threshold value, does not decrease below the manipulation input detection threshold value again within a predetermined long pressing determination time.

16. The steering device according to claim 10, wherein the manipulation input detection unit determines that the manipulation input is a long pressing manipulation when the capacitance detection value, increasing beyond the manipulation input detection threshold value again after having decreased below the manipulation input detection threshold value, does not decrease below the manipulation input detection threshold value again within a predetermined long pressing determination time.

17. The steering device according to claim 1, wherein the sensor electrode includes a first electrode and a second electrode provided independently, and
the manipulation input detection unit determines that the manipulation input occurs, when a change in the capacitance detection value by which the occurrence of the manipulation input is detected exists on one of the first electrode and the second electrode and the change in the capacitance detection value by which the occurrence of the manipulation input is detected does not exist on the other one of the first electrode and the second electrode.

18. The steering device according to claim 1, wherein the first electrode and the second electrode are used as an electrode pair, and a plurality of the electrode pairs are provided in the steering wheel.

* * * * *